(12) United States Patent
Okamoto et al.

(10) Patent No.: US 7,778,133 B2
(45) Date of Patent: Aug. 17, 2010

(54) OPTICAL INFORMATION RECORDING/REPRODUCING APPARATUS

(75) Inventors: Kaoru Okamoto, Tokyo (JP); Jun Sumioka, Kawasaki (JP); Masakuni Yamamoto, Yamato (JP)

(73) Assignee: Canon Kabushiki Kaisha, Tokyo (JP)

( * ) Notice: Subject to any disclaimer, the term of this patent is extended or adjusted under 35 U.S.C. 154(b) by 817 days.

(21) Appl. No.: 11/689,643

(22) Filed: Mar. 22, 2007

(65) Prior Publication Data
US 2007/0223341 A1    Sep. 27, 2007

(30) Foreign Application Priority Data
Mar. 24, 2006    (JP) ............... 2006-082975

(51) Int. Cl.
*G11B 7/00* (2006.01)
(52) U.S. Cl. ............... 369/59.21; 369/59.22; 369/53.35
(58) Field of Classification Search .............. 369/59.21, 369/59.22, 53.35
See application file for complete search history.

(56) References Cited

U.S. PATENT DOCUMENTS

| | | | |
|---|---|---|---|
| 5,729,518 A | 3/1998 | Kobayashi | 369/59 |
| 6,094,510 A | 7/2000 | Yaguchi et al. | 382/232 |
| 7,027,375 B2 * | 4/2006 | Shimizu | 369/59.12 |
| 7,082,091 B2 * | 7/2006 | Shimizu et al. | 369/59.24 |
| 2004/0100883 A1 * | 5/2004 | Sakagami | 369/47.35 |
| 2005/0213462 A1 * | 9/2005 | Maegawa | 369/59.11 |
| 2007/0223341 A1 | 9/2007 | Okamoto et al. | 369/59.21 |

FOREIGN PATENT DOCUMENTS

| | | |
|---|---|---|
| EP | 0 540 345 A1 | 5/1993 |
| JP | 5-128530 | 5/1993 |
| JP | 9-181613 | 7/1997 |

OTHER PUBLICATIONS

Noboru Sasa et al., "Write-Once Disks for Multi-level Optical Recording", International Symposium on Optical Memory 2003 Nara-ken New Public Hall (Shin-Kokaido), Nara, Japan, 2 pages, No. 201, Nov. 2003.

* cited by examiner

*Primary Examiner*—Wayne R Young
*Assistant Examiner*—Latanya Bibbins
(74) *Attorney, Agent, or Firm*—Fitzpatrick, Cella, Harper & Scinto

(57) ABSTRACT

An optical information recording/reproducing apparatus is adapted to record and/or reproduce multilevel information on/or from an optical information recording medium. The multilevel information is recorded in the form of pits in cells virtually formed at regular intervals on a track. The respective levels are represented by varying the length or the area of information pits such that a reproduced signal has a different amplitude level depending on the length or the area of information pits. A reproduced signal correction circuit corrects a reproduced signal obtained by performing sampling at the center of each cell. An error power calculation circuit calculates error power on the basis of the difference between the corrected reproduced signal and an ideal value of each level of the cell. A decoder performs decoding on the basis of the calculated error power values.

5 Claims, 10 Drawing Sheets

TRACK DIRECTION →
S (CENTER)
LEVEL
3-BIT BINARY DATA

| LEVEL | 3-BIT BINARY DATA |
|---|---|
| 0 | 000 |
| 1 | 001 |
| 2 | 010 |
| 3 | 011 |
| 4 | 110 |
| 5 | 111 |
| 6 | 100 |
| 7 | 101 |

REGION (CELL) IN WHICH ONE INFORMATION PIT IS RECORDED

| TABLE | PREVIOUS CELL | CURRENT CELL | FOLLOWING CELL |
|---|---|---|---|
| 1 | 0 | 0 | 0 |
| 2 | 0 | 1 | 0 |
| 3 | 0 | 2 | 0 |
| 4 | 0 | 3 | 0 |
| ⋮ | ⋮ | ⋮ | ⋮ |
| 511 | 7 | 6 | 7 |
| 512 | 7 | 7 | 7 |

| (D0 D1 D2 D3) | (L0 L1 L2 L3) |
|---|---|
| (1000) | (1000)– |
| (1001) | (0111)– |
| (1011) | (1101)– |
| (1010) | (0010)– |
| (1110) | (1110)– |
| (1111) | (0001)– |
| (1101) | (1011)– |
| (1100) | (0100)– |
| (0100) | (1100)– |
| (0101) | (0011)– |
| (0111) | (1001)– |
| (0110) | (0110)– |
| (0010) | (1010)– |
| (0011) | (0101)– |
| (0001) | (1111)– |
| (0000) | (0000)– |

FIG. 10

| (X,Y,Z) | S1 OR S2 OR S3 OR S4 |
|---|---|
| (0,0,0) | 0 |
| (0,0,1) | 1 |
| (0,1,0) | 2 |
| (0,1,1) | 3 |
| (1,1,0) | 4 |
| (1,1,1) | 5 |
| (1,0,0) | 6 |
| (1,0,1) | 7 |

FIG. 13

| (S1,S2,S3,S4) | METRIC |
|---|---|
| (0000) | E0+E0+E0+E0 |
| (0002) | E0+E0+E0+E2 |
| (0004) | E0+E0+E0+E4 |
| (0006) | E0+E0+E0+E6 |
| (0020) | E0+E0+E2+E0 |
| (0022) | E0+E0+E2+E2 |
| ⋮ | ⋮ |
| (6646) | E6+E6+E4+E6 |
| (6660) | E6+E6+E6+E0 |
| (6662) | E6+E6+E6+E2 |
| (6664) | E6+E6+E6+E4 |
| (6666) | E6+E6+E6+E6 |

OPTICAL INFORMATION RECORDING/REPRODUCING APPARATUS

BACKGROUND OF THE INVENTION

1. Field of the Invention

The present invention relates to an optical information recording/reproducing apparatus adapted to record/reproduce multilevel information on/from an information recording medium such as an optical disk. More particularly, the present invention relates to a multilevel data processing apparatus adapted to easily process multilevel data subjected to trellis-coded modulation.

2. Description of the Related Art

In a conventional optical disk, binary digital data is recorded on a track formed in a spiral shape or tracks in the form of concentric circles by forming recessed or embossed pits (in the case of ROM disks), by forming pits in an organic/inorganic recording film (in the case of write-once read-many optical disks), or by changing the crystal state (in the case of phase-changing disks). To reproduce such data, a track is illuminated with a laser beam, and a reproduced RF signal is obtained by detecting a variation in strength of reflected light or a variation in polarization direction due to the magnetic Kerr effect. The binary data is then detected from the reproduced RF signal.

In recent years, research and development has been performed with the objective of achieving a greater recording density for data recorded on an optical disk. One technique for increasing the recording density is to reduce the size of a light spot used to record/reproduce information. To this end, a recent trend is to use blue-violet light (with a wavelength of 405 nm) rather than red light (with a wavelength of 650 nm). Another trend is to increase the numeric aperture of an objective lens from 0.6 to 0.85. Another technique for increasing the recording density without reducing the light spot size is to represent data in a more efficient manner using a multilevel representation technique.

Japanese Unexamined Patent Application Publication No. 5-128530, filed by the same applicant as the applicant for the present invention, discloses a technique to record/reproduce multilevel information.

In this technique, when multilevel information is recorded, the value of each pit recorded on a track of on an optical information recording medium is represented by a combination of the length of each pit as measured along the track and a shift of the pit in the direction along the track with reference to the light spot used in reproduction. The multilevel information recorded in the form of information pits is reproduced by comparing the signal detected by the light spot with learning data of signals.

In a technique disclosed in a presentation ("Writeonce Disks for Multi-level Optical Recording", Fr-Po-04) at ISOM 2003, recording/reproducing of multilevel (8-level) data was achieved by forming virtual regions (called cells) on an optical disk with a track pitch of 0.46 μm and writing/reading data in/from cells via an optical system including a light source having a numeric aperture (NA) of 0.65 and including a light source configured to emit blue-violet light (with a wavelength of 405 nm).

When data is recorded on the information recording medium, original binary data is converted into 8-level data and resultant 8-level data is recorded. That is, 8-level data corresponding to 3-bit binary data is recorded in one cell.

For example, 3-bit information is defined as follows: (0, 0, 0) indicates level "0"; (0, 0, 1) indicates level "1"; (0, 1, 0) indicates level "2"; (0, 1, 1) indicates level "3"; (1, 1, 0) indicates level "4"; (1, 1, 1) indicates level "5"; (1, 0, 0) indicates level "6"; and (1, 0, 1) indicates level "7".

Each of the above-described eight levels is represented by forming a pit to have a length equal to a selected integral number times one-sixteenth of the total cell length in the track direction, as shown in FIG. 1. That is, level "0" is represented by an information pit with a length of 0, level "1" is represented by an information pit with a length of 2 times one-sixteenth of the total cell length, level "2" is represented by an information pit with a length of 4 times one-sixteenth of the total cell length, level "3" is represented by an information pit with a length of 6 times one-sixteenth of the total cell length, level "4" is represented by an information pit with a length of 8 times one-sixteenth of the total cell length, level "5" is represented by an information pit with a length of 10 times one-sixteenth of the total cell length, level "6" is represented by an information pit with a length of 12 times one-sixteenth of the total cell length, and level "7" is represented by an information pit with a length of 14 times one-sixteenth of the total cell length.

When information pits representing various levels in the above-described manner are recorded at random and light reflected from these information pits is detected by a photodetector, the amplitude of the reproduced signal detected from the multilevel information pits has a distribution, for example, such as that shown in FIG. 2.

Sampling is performed when the center of the light spot comes to the center of the length of a cell in the direction along the track.

Note that values of respective levels are normalized such that the output signal level becomes "1" for the reproduced signal obtained for a sequence of a plurality of information pits with data level of "0" (no information is written), and the output signal level becomes "0" for a sequence of a plurality of information pits with data level of "7".

The reason the magnitude of each level of the reproduced signal is scattered over a particular range is that the magnitude of a signal detected from an information pit of interest is influenced by preceding and following information pits; that is, intersymbol interference occurs.

If the amplitude distribution of each level of the reproduced signal overlaps the distribution of an adjacent level, as in the example shown in FIG. 2, it can be impossible to completely distinguish adjacent levels using fixed threshold values.

In the technique disclosed in ISOM 2003, learning is first performed. In the learning process, reproduced signals are read for a plurality of pit sequences each including three successive information pits having known values (i.e., a current pit of interest, the previous pit, and the following pit). The result is recorded as learning data.

When actual reproduced signals are read from information pits, the obtained reproduced signals are compared with the learning data (that is, correlation is checked) to correctly detect signal levels, which thereby can solve the above-described problem with intersymbol interference.

In addition to intersymbol interference, optical disks also have a problem in that a level variation or an amplitude variation can occur because of various factors such as a difference in reflectance among optical disks or a difference in reproduction frequency characteristics between inner tracks and outer tracks on the same optical disk. Such a level variation can cause an error in detection of the level of a reproduced signal even when the detection is performed using learning data according to the above-described technique. Japanese Patent No. 3475627 discloses a reproducing apparatus capable of correctly reproducing data even when both random noise and signal distortion such as intersymbol interference exist.

In the reproducing apparatus, levels of multilevel data subjected to trellis coded modulation are tentatively determined by a plurality of tentative data level detection units, each of which is configured to tentatively determine a particular part of the multilevel data. Reproduced data values are estimated on the basis of the tentatively determined data values, and decoding is performed by determining distances from reference values.

FIG. 3 is a block diagram showing a decoder according to the above technique. An input signal is supplied to 8 2-dimensional decoders 301-1 to 301-8 and recorded data are tentatively decoded. On the basis of tentative values of the data output from the 2-dimensional decoders 301-1 to 301-8, value prediction units 302-1 to 302-8 estimate correct reproduced data, and adders 303-1 to 303-8 calculate distances between the actual reproduced data values and the estimated correct values. Square circuits 304-1 to 304-8 determine error power by squaring the distances (differences) and supply the result to a Viterbi decoder 305, which decodes the multilevel data. This technique is said to be capable of achieving high decoding performance even when the reproduced signal includes random noise or signal distortion or both.

Thus, in the above-described technique, the trellis coded modulation is applied to part of multilevel data, the part of data is tentatively decoded by the plurality of tentative data level detection units, and the final decoded data is determined by calculating the distance between the data estimated on the basis of the tentative values and the reference values. However, the above-described technique has the following problems.

In the technique described above, the signal input to the decoder includes two symbols, and each tentative data level detection unit includes 8 2-dimensional decoders. Each 2-dimensional decoder has 8 reference values, and thus there are a total of 64 reference values. In the case of an input signal including 4 symbols, that is, in the case of a 4-dimensional signal, the tentative data level detection unit is configured to include a plurality of 4-dimensional decoders, and $8^4$ or 4096 reference values are needed to decode 8-level data. That is, the necessary number of reference values increases exponentially with the dimension.

Thus, in the case of a reproducing apparatus having a tentative data level detection unit including m-dimensional decoders for decoding n-level multilevel data, as many as nm learning tables are needed for use by the value prediction units 302. To obtain high decoding performance, it is necessary to increase m. However, this results in an increase in the integration degree of a memory integrated circuit. Another problem is that when learning data stored in the memory integrated circuit is updated while reproducing random data, there are a small number of applicable data, and thus updating of the learning data is not performed frequently, which can result in a reduction in decoding performance. When test data is used to update the learning data, the learning can require a long time.

SUMMARY OF THE INVENTION

In view of the above, the present invention provides a technique for simplifying the learning table and reducing the learning time in the processing of multilevel data using multidimensional trellis coded modulation.

More particularly, the present invention provides an optical information recording/reproducing apparatus adapted to record and/or reproduce multilevel information taking three or more levels on or from an optical information recording medium adapted to record and/or reproduce information using a light spot on or from information pits formed on a track of the optical information recording medium, the information pits being formed in cells virtually formed at regular intervals on the track, the respective levels being represented by varying the length of information pits as measured in a direction along the track information pits or varying the area of the information pits such that a reproduced signal has a different amplitude level depending on the length or the area of information pits, comprising a reproduced signal correction circuit adapted to correct a reproduced signal obtained by performing sampling at the center of each cell, an error power calculation circuit adapted to calculate error power on the basis of the difference between the corrected reproduced signal output from the reproduced signal correction circuit and an ideal value of each level of the cell, and a decoder adapted to perform decoding on the basis of the value obtained by the error power calculation circuit.

Further features of the present invention will become apparent from the following description of exemplary embodiments with reference to the attached drawings.

BRIEF DESCRIPTION OF THE DRAWINGS

FIG. 10 is a table indicating a rule of conversion between binary data and octal data performed by a multilevel converter according to an embodiment of the present invention.

FIG. 13 is a table showing combinations of a metric and error power according to an embodiment of the present invention.

DESCRIPTION OF THE EMBODIMENTS

The present invention is described in further detail below with reference to embodiments in conjunction with the accompanying drawings.

Figure 4:
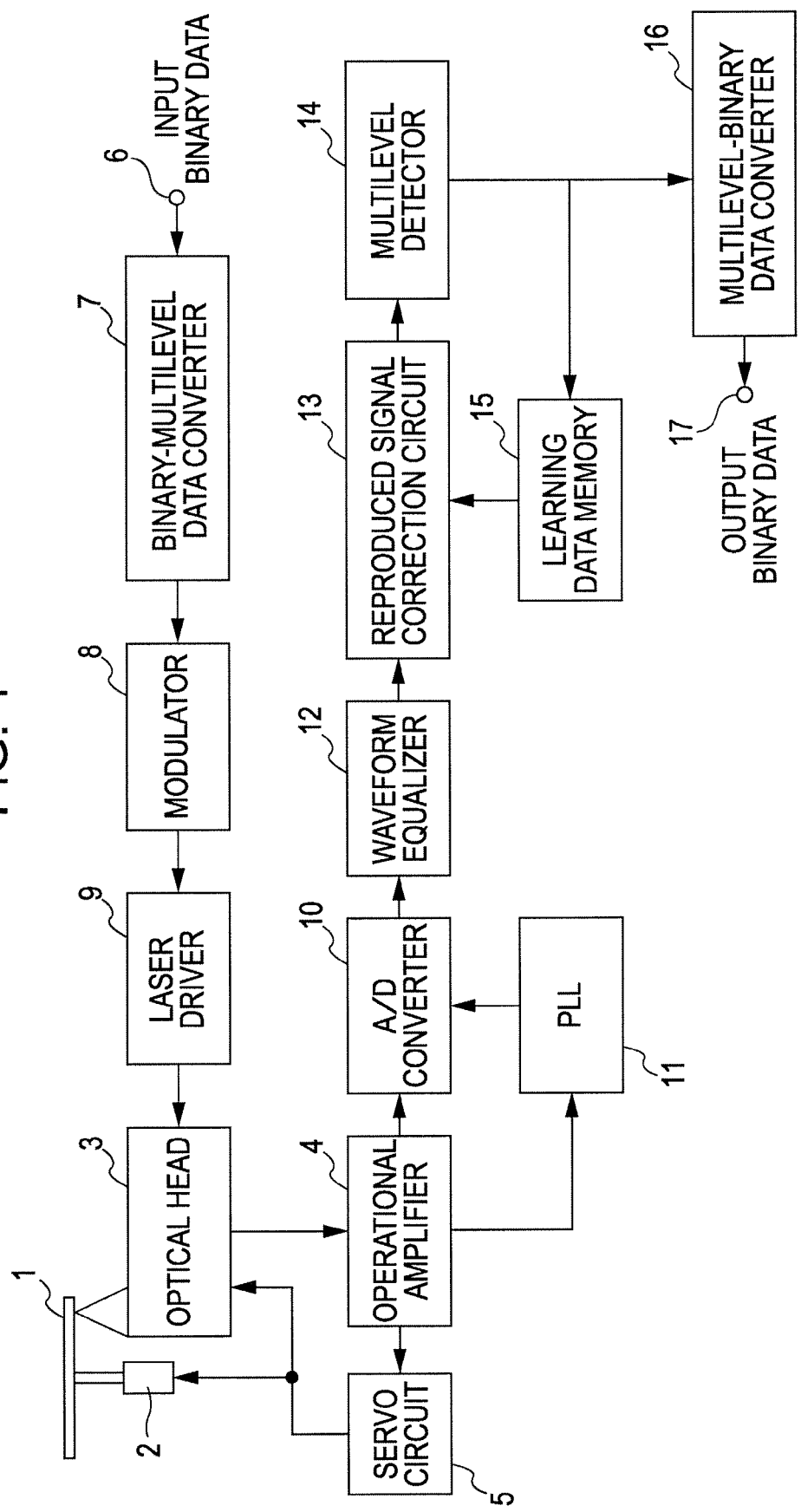
FIG. 4 is a block diagram showing an optical disk apparatus according to an embodiment of the present invention.

FIG. 4 is a block diagram showing a multilevel information recording/reproducing apparatus according to an embodiment of the present invention.

In FIG. 4, reference numeral 1 denotes an optical disk used as an information recording medium on which a track in a spiral shape or concentric circular tracks are formed, and reference numeral 2 denotes a spindle motor adapted to rotate the optical disk 1.

Figure 1:
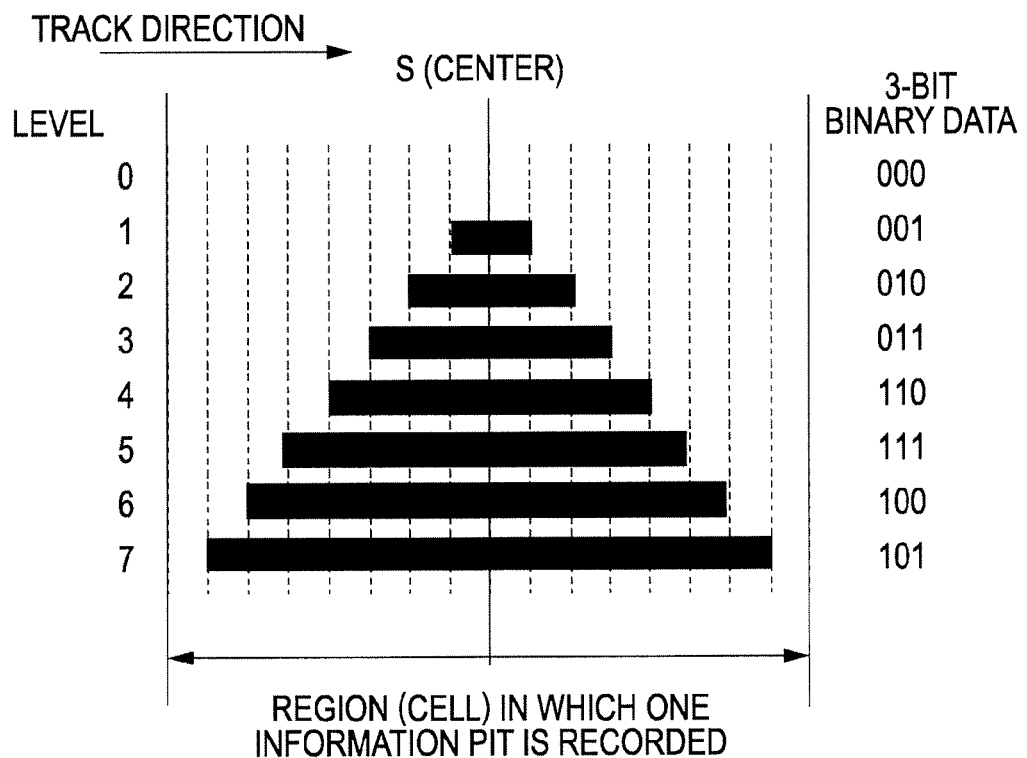
FIG. 1 is a diagram showing a manner in which a plurality of values are represented by varying the length of a multilevel information pit as measured in a direction along a track, wherein corresponding 3-bit binary values are also shown.
Figure 2:
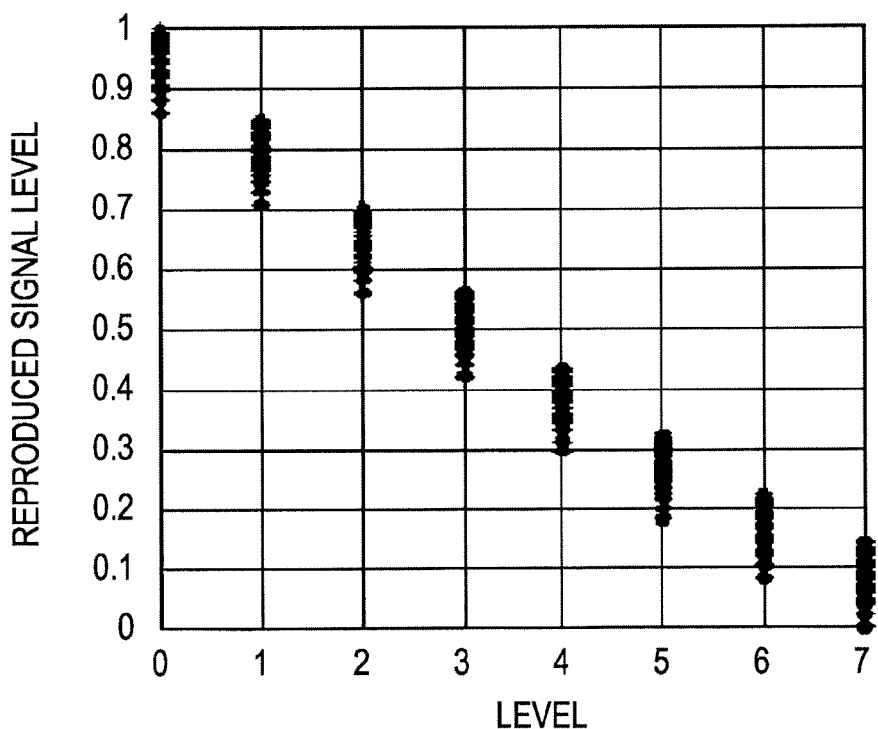
FIG. 2 is a diagram showing the amplitude distribution of each level of a reproduced multilevel information signal.
Figure 3:
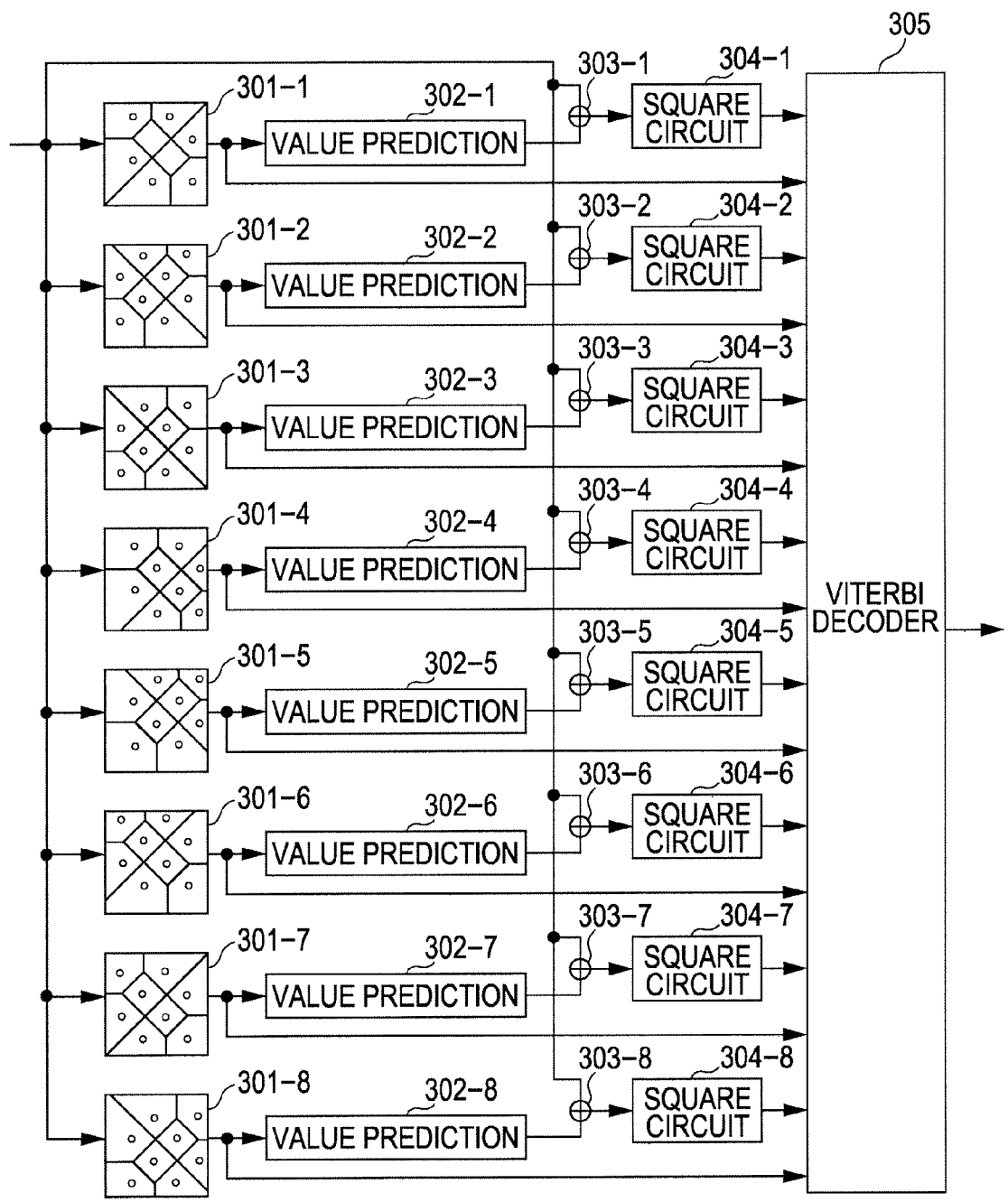
FIG. 3 is a block diagram showing a multilevel data decoder according to a conventional technique.

On the optical disk 1, cells are virtually formed at regular intervals in a direction along a track as described above with reference to FIG. 1, and multilevel information is recorded thereon such that the value of each information pit is represented by varying the length (or the area) of the information pit formed in each cell.

Reference numeral 3 denotes an optical head adapted to record/reproduce multilevel information on/from the optical disk 1. More specifically, a laser beam emitted from a semiconductor laser used as a light source is focused, via an objective lens, into a light spot on the optical disk 1. Reflected light from the optical disk 1 is detected by a photodetector disposed in the optical head 3, and a detected signal is supplied to an operational amplifier 4.

The operational amplifier 4 processes the signal supplied from the photodetector of the optical head 3 to detect a focus error signal/tracking error signal for controlling the light spot so as to scan along a particular track on the optical disk 1.

In accordance with the detected focus error signal/tracking error signal, a servo circuit 5 controls a focus actuator/tracking actuator in the optical head 3 so as to correctly perform focus control/tracking control.

The servo circuit 5 also controls the spindle motor 2 such that the rotation of the optical disk 1 is controlled at a constant linear or angular velocity.

To record multilevel information on the optical disk 1, the multilevel converter 7 converts input binary data input from terminal 6 into multilevel data, and a modulator 8 outputs a signal corresponding to the multilevel data.

A laser driver 9 drives the semiconductor laser disposed in the optical head 3 in accordance with the signal output from the modulator 8 so as to record marks corresponding to the multilevel information on the track of the optical disk 1.

When the multilevel information is reproduced, the optical disk 1 is illuminated with a reproduction light spot formed by the optical head 3, and reflected light from the optical disk 1 is detected by the photodetector. The operational amplifier 4 processes the signal detected by the photodetector. The resultant signal is then converted into a digital form by an analog-to-digital converter 10.

The above-described processes are performed in synchronization with a clock signal generated by a PLL circuit 11. The resultant signal is supplied to an equalizer 12. The waveform-equalized signal output from the equalizer 12 is supplied to a reproduced signal correction circuit 13. The reproduced signal correction circuit 13 corrects the reproduced signal in accordance with learning data stored in the learning data memory 15 as will be described in further detail later. The corrected signal output from the reproduced signal correction circuit 13 is supplied to a multilevel-data level detector 14. The multilevel-data level detector 14 detects the level of the received signal. The learning data stored in the learning data memory 15 may be updated in accordance with the result of the level detection. Then, the multilevel data is converted into binary data by a multilevel-binary data converter 16, and the resultant binary data is output from terminal 17.

The multilevel data recorded on the optical disk is described in further detail below.

Figures 8, 9:
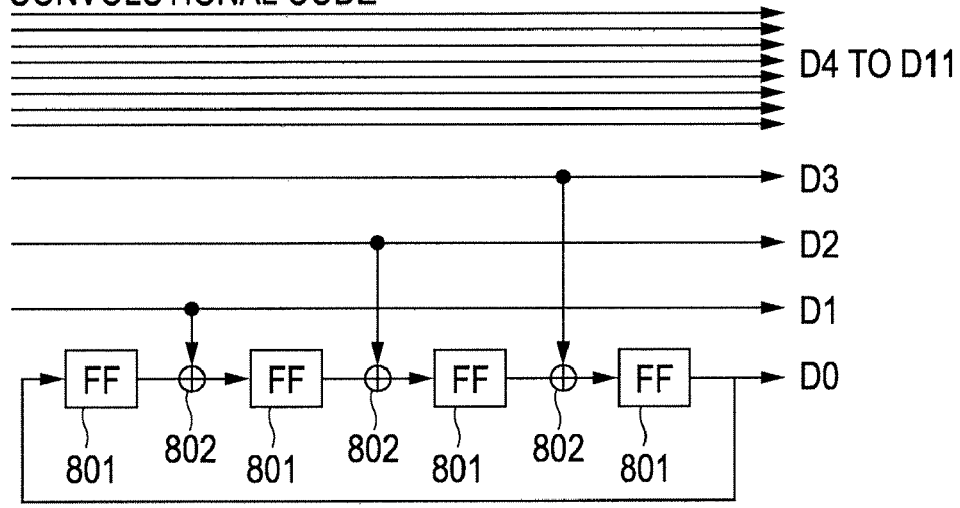
FIG. 8 is a diagram showing an example of a convolutional encoder according to an embodiment of the present invention.
FIG. 9 is a table indicating a rule of a bit conversion performed by a mapping circuit according to an embodiment of the present invention.

In the case of trellis coded modulation of 4-dimensional multilevel data, coding is performed by a convolutional encoder shown in FIG. 8. The convolutional encoder includes flip-flops 801 and XOR circuits 802. First, of D1 to D11 of given binary data, D0 is output using only D1 to D3.

D0 to D3 are then mapped to L0 to L3 in accordance with a bit conversion table shown in FIG. 9. The mapping may be performed using a memory integrated circuit. In the mapping using the convolutional encoder according to the present embodiment, the mapping is performed such that the distance of a shortest joining path on the 16-state trellis diagram corresponding to the convolutional encoder is maximized.

A method of converting binary data L0, L1, L2, L3, D4 ... D11 to octal data S1, S2, S3, S4 is described below. First, 12-bit binary data is divided into four 3-bit parts (X, Y, Z) such as (D11, D7, L3), (D10, D6, L2), (D9, D5, L1), and (D8, D4, L0). Thereafter, 3-bit binary data (X, Y, Z) is converted into octal data corresponding to one of 0 to 7 in accordance with a conversion table shown in FIG. 10, and the result is output as a symbol of S1, S2, S3, or S4.

The resultant symbol is recorded, via the modulator 8, the laser driver 9, and the optical head 3.

The reproduced signal correction circuit 13 is described in further detail below. In the present embodiment, it is assumed that the reproduced multilevel data takes eight values from 0 to 7.

Figure 5:
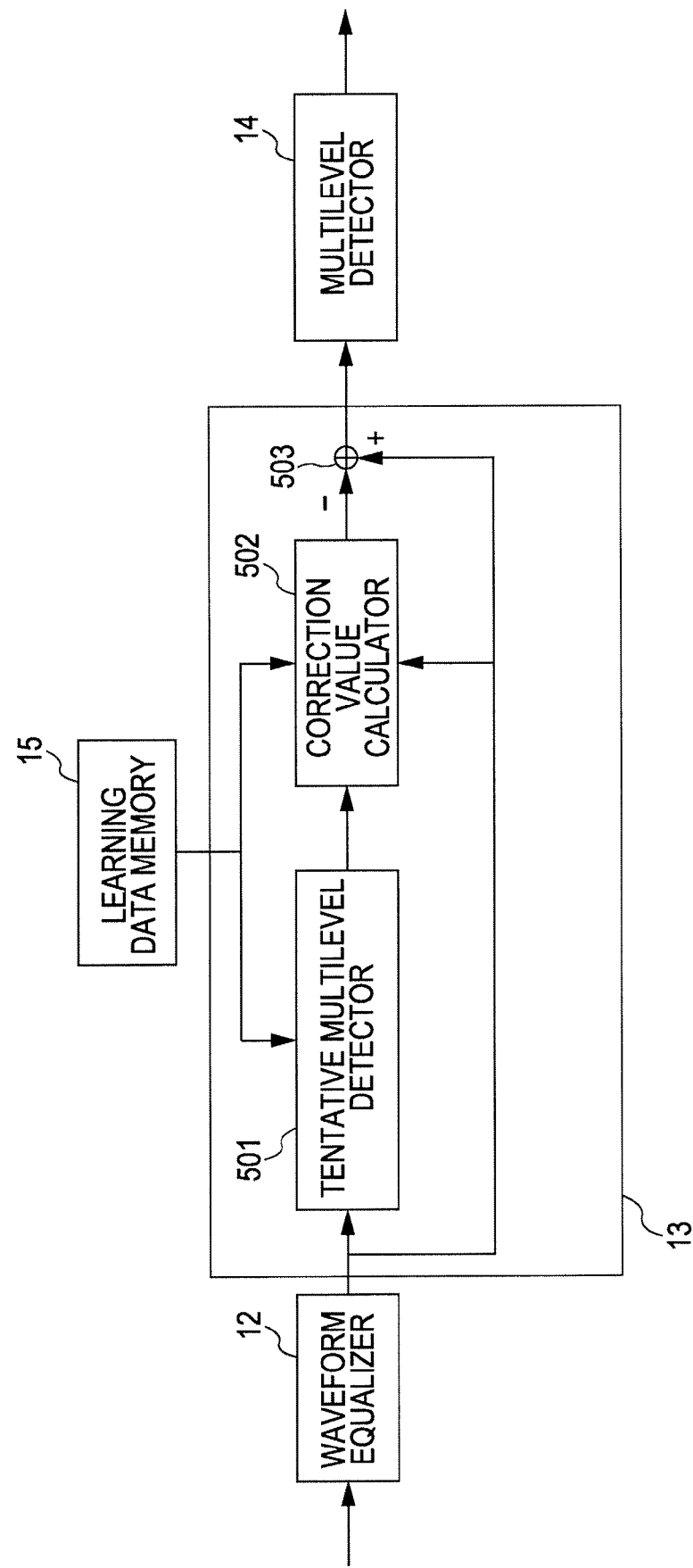
FIG. 5 is a block diagram showing a reproduced signal correction circuit according to an embodiment of the present invention.

FIG. 5 shows a general configuration of the reproduced signal correction circuit 13. After the reproduced signal is subjected to the waveform equalization in waveform equalizer 12, the reproduced signal is input to a tentative multilevel detector 501. The tentative multilevel detector 501 detects a tentative level (0 to 7) using a learning table stored in the learning data memory 15. A correction value calculator 502 determines a correction value for the reproduced signal. The reproduced signal is corrected by subtracting the correction value from the waveform-equalized reproduced signal.

Figures 6, 7:
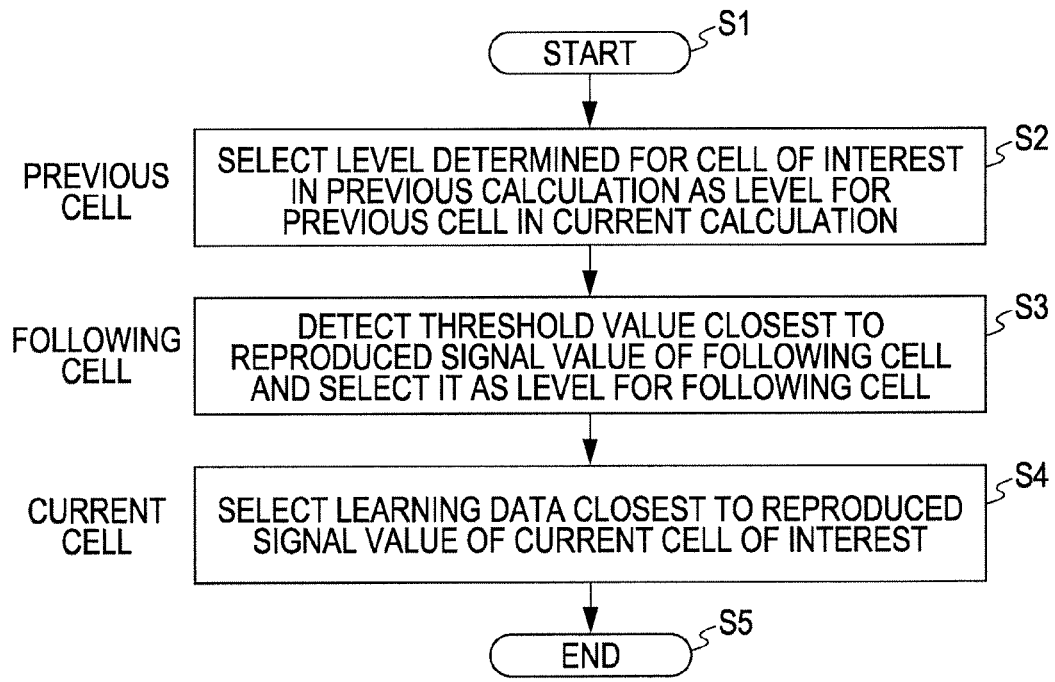
FIG. 6 is a flow chart showing a process performed by a reproduced signal correction circuit.
FIG. 7 shows a learning table stored in a learning data memory according to an embodiment of the present invention.

An example of the content of the learning data memory 15 is shown in FIG. 7. The reproduced signal strength is determined by learning for a total of 512 (8×8×8) combinations of values of a previous cell, a current cell, and a following cell, and the resultant 512 reference values are stored in the form of a learning table in the learning data memory 15.

For example, information indicating the 512 patterns is recorded at the beginning of a user data area of the optical disk 1. Before reproducing the information recorded in the user data area, the reproduced signal of the current cell of interest is detected for each pattern, and the sampled values are stored as reference values in the learning data memory 15.

The multilevel-data tentative-level detector 501 is described in further detail below with reference to FIGS. 6 and 7. The multilevel-data tentative-level detector 501 determines a candidate value for the current cell of interest from three successive cells (the previous cell, the current cell of interest, and the following cell).

In step S1, when a reproduced signal is input to the multilevel-data tentative-level detector 501, the operation starts.

In step S2, the value of the previous cell is determined. In the determination in this step, the value of a cell of interest determined in a previous operation is used.

For example, if the value of the cell of interest determined in the previous operation is "7", then the value of the previous cell is tentatively determined as "7".

Alternatively, the value of the previous cell may be tentatively determined by comparing the reproduced signal (the value sampled when the light spot is at the center of the previous cell) with a plurality of threshold values corresponding to the respective levels (that is, by means of level slicing).

In step S3, the value of the following cell is tentatively determined by comparing the reproduced signal of the following cell (sampled when the light spot is at the center of the following cell) with the threshold values corresponding to the respective levels. Note that in the comparison, when the reproduced signal is closest to a particular level, it is determined that the value of the following cell is equal to this level.

Herein, by way of example, let us assume that the value of the following cell has been determined to be "7".

By this stage, of three successive cells, the values of the previous cell and the following cell have been tentatively determined.

Next, in step S4, a value closest to the reproduced signal sampled at the center of the current cell of interest is detected from the learning data stored in the learning data memory 15 (FIG. 7) using the values tentatively determined for the previous cell and the following cell.

In this specific example, because both the previous cell and the following cell have a value of "7", allowable patterns are limited to eight patterns (7, 0, 7) to (7, 7, 7) of the total of 512 patterns.

Of these eight patterns, a pattern with a value of the central cell closest to the reproduced signal is selected, and the value of the central cell of this selected patterns is employed as the value for the reproduced signal.

In step S5, the level of the cell of interest determined in the above-described manner is output. Thus, the operation of the multilevel-data tentative-level detector 501 is completed.

Now, the correction value calculator 502 is described in further detail below.

Three signals are input to the correction value calculator 502. They are the learning data stored in the form of table in the learning data memory 15, the multilevel data the value of which has been tentatively determined by the multilevel-data tentative-level detector 501, and the waveform-equalized reproduced signal. A combination of three values closest to the combination of the values of the three successive cells indicated by the input multilevel data is extracted from the table stored in the learning data memory 15, and the difference between the value of the central cell of the extracted pattern and the actual reproduced signal is calculated, thereby determining the correction value.

Finally, an adder 503 adds the correction value to the reproduced signal. Thus, the correction for the reproduced signal by the reproduced signal correction circuit 13 is completed.

The multilevel-data level detector 14 is described in further detail below. In the present embodiment, by way of example, it is assumed that 4-dimensional multilevel data (multilevel data of four cells) is reproduced.

Figure 11:
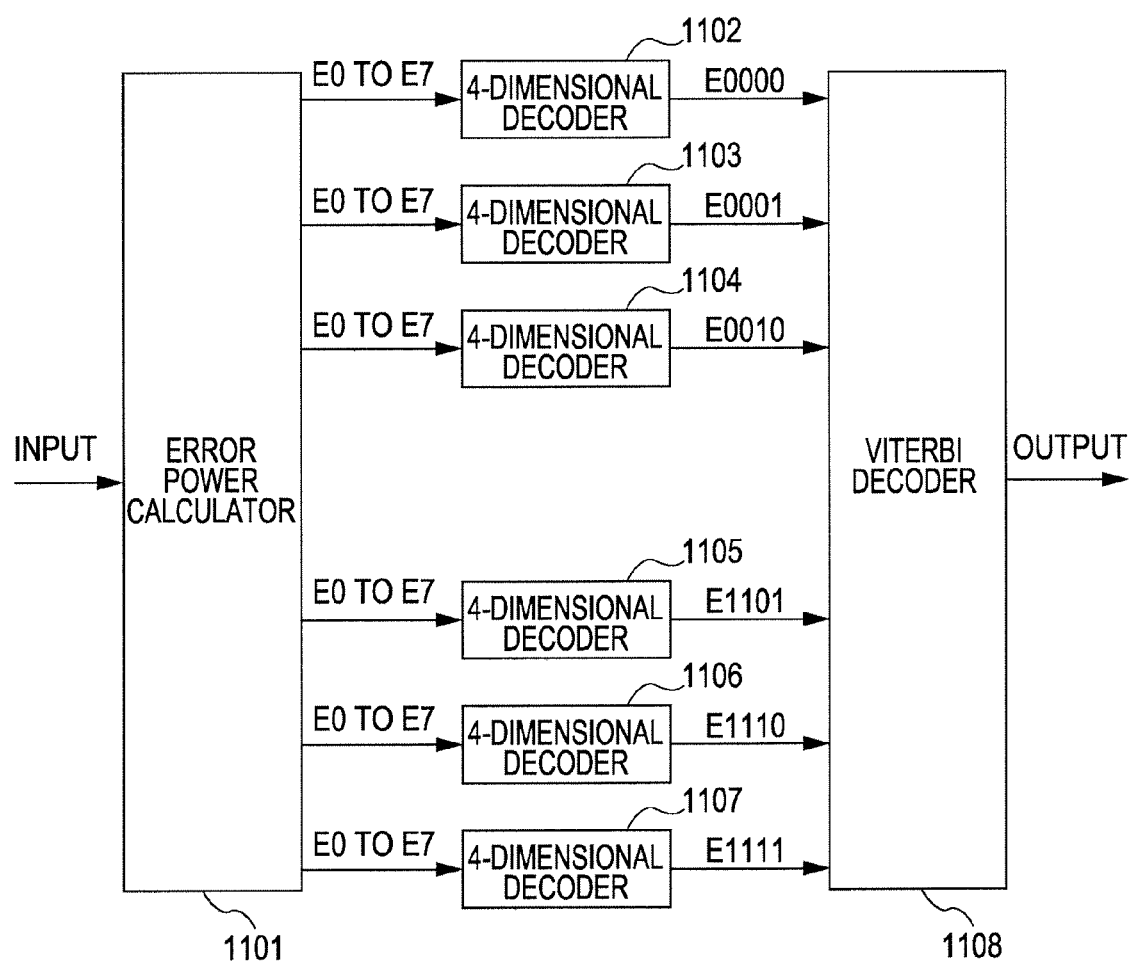
FIG. 11 is a diagram schematically showing a multilevel-data level detector according to an embodiment of the present invention.

FIG. 11 shows a general configuration of the multilevel-data level detector 14.

If the corrected reproduced signal is input to the multilevel-data level detector 14, an error power calculation circuit 1101 calculates error power E0 to E7 using eight ideal values.

Thereafter, 4-dimensional decoders corresponding to the same LSB bit select a minimum error power value and calculate branch metrics E0000 to E1111.

The calculated branch metrics are input to a Viterbi decoder 1108. The Viterbi decoder 1108 outputs decoded multilevel data.

The error power calculation circuit 1101 is described in further detail below with reference to FIG. 12.

Because the reproduced signal is input to the error power calculation circuit 1101 after the reproduced signal has been corrected by the reproduced signal correction circuit 13, the reproduced signal input to the error power calculation circuit 1101 has a value very similar to the ideal value of the cell of interest regardless of the value of the previous cell and the value of the following cell.

Figure 12:
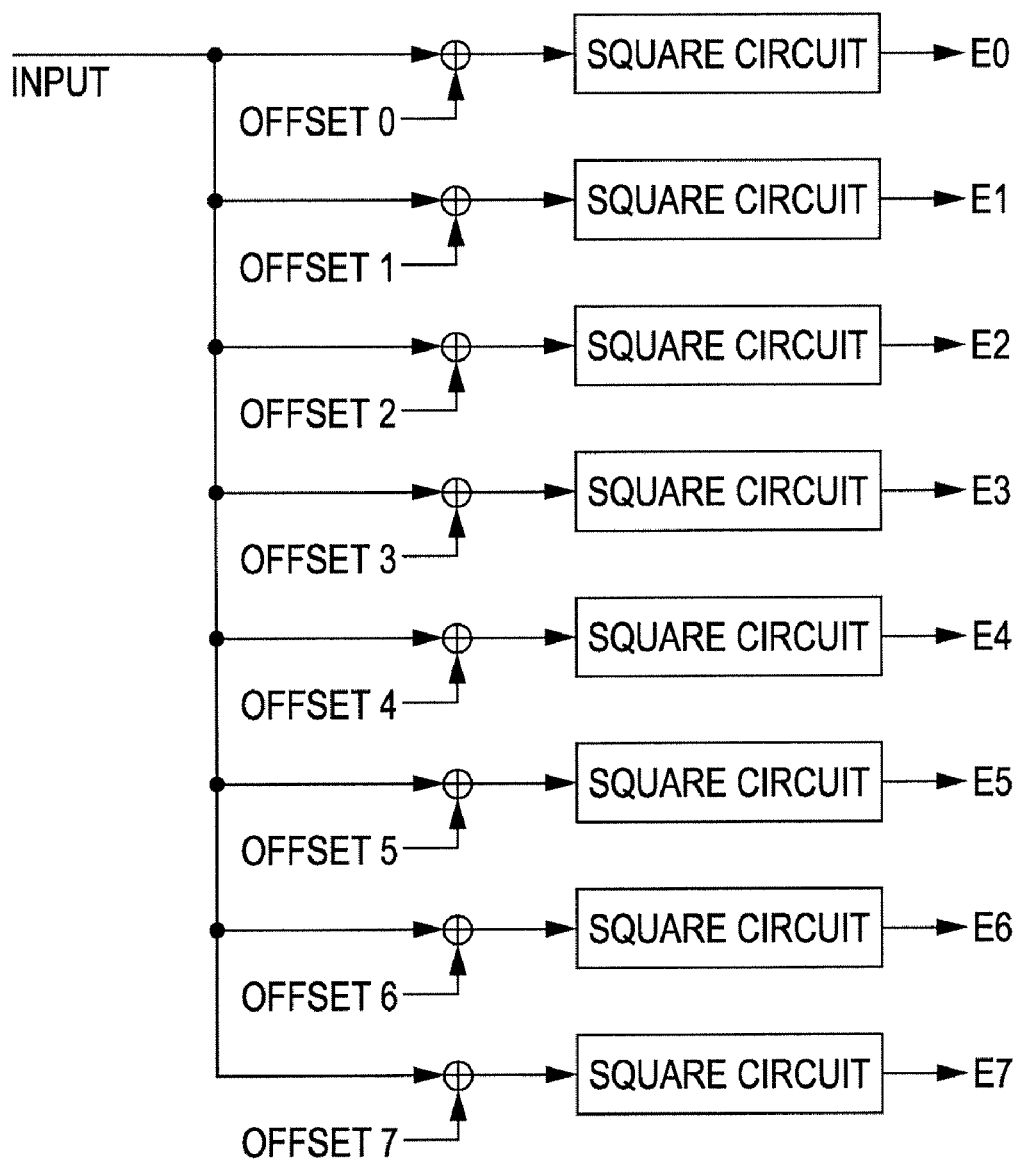
FIG. 12 is a diagram showing an error power calculation circuit according to an embodiment of the present invention.

The error power calculation circuit 1101 calculates the error power E0 to E7 by calculating the distance from the corrected value supplied output from the reproduced signal correction circuit 13 to each of the ideal values OFFSET-0 to OFFSET-7 of the respective levels as shown in FIG. 12. To determine the distance, the difference between the corrected value of the current cell of interest and the ideal value of each level is squared.

A specific method of determining the ideal values OFFSET-0 to OFFSET-7 is described below.

In the following description, by way of example, it is assumed that the ideal values are determined from the learning data in the form of the learning table shown in FIG. 7 for particular combinations of previous, current, and following cells described below. That is, OFFSET-0 is given by the reference value of the cell of interest for a combination of (level of previous cell, level of current cell, level of following cell)=(0, 0, 0), OFFSET-1 is given by the reference value of the cell of interest for a combination of (level of previous cell, level of current cell, level of following cell)=(1, 1, 1), OFFSET-2 is given by the reference value of the cell of interest for a combination of (level of previous cell, level of current cell, level of following cell)=(2, 2, 2), OFFSET-3 is given by the reference value of the cell of interest for a combination of (level of previous cell, level of current cell, level of following cell)=(3, 3, 3), OFFSET-4 is given by the reference value of the cell of interest for a combination of (level of previous cell, level of current cell, level of following cell)=(4, 4, 4), OFFSET-5 is given by the reference value of the cell of interest for a combination of (level of previous cell, level of current cell, level of following cell)=(5, 5, 5), OFFSET-6 is given by the reference value of the cell of interest for a combination of (level of previous cell, level of current cell, level of following cell)=(6, 6, 6), and OFFSET-7 is given by the reference value of the cell of interest for a combination of (level of previous cell, level of current cell, level of following cell)=(7, 7, 7).

Note that the manner of determining the ideal values OFFSET-0 to OFFSET-7 is not limited to that described above. For example, an ideal value may be given by the average value of the values of 64 combinations having the same level for the cell of interest.

In the present embodiment, the error power calculation circuit 1101 is configured so as to have only eight ideal values, and thus the configuration of the error power calculation circuit 1101 can be very simple as shown in FIG. 12.

Next, the 4-dimensional decoders 1102 to 1107 are described. In the present embodiment, because the convolutional encoder is configured to have a constraint length of 5, there are 16 states and thus there are 16 4-dimensional decoders.

The 4-dimensional decoder 1102 calculates the error power on the assumption that LSBs (L0, L1, L2, L3) of four successive reproduced data are (0, 0, 0, 0). As can be seen from FIG. 10, symbols which are "0" in LSB are limited to "0", "2", "4", and "6". Thus, in this case, as shown on the left-hand side of FIG. 13, there are 256 combinations of symbols of four successive cells S1, S2, S3, and S4. The metrics for these 256 combinations of symbols can be calculated simply by adding the error power E0, E2, E4 and E6 as shown on the right-hand side of FIG. 13 without having to refer to the learning data stored in the learning data memory. A metric having a least value is selected from the calculated metrics of the 256 combinations and output as a branch metric E0000 for (L0, L1, L2, L3) that is (D0, D1, D2, D3). From the symbols having the least value in the metric, high-order bits D4 to D11 are tentatively decoded. Note that when the path is finally determined such that (D0, D1, D2, D3)=(0, 0, 0, 0) in a following process performed by the Viterbi decoder 1108, the high-order bits D4 to D11 are output as finally determined values.

In the case of the 4-dimensional decoders 1103 to 1107, calculation of the error power is performed on the assumption that LSBs (L0, L1, L2, L3) of four successive reproduced data are any one of 15 possible combinations of values (0, 0, 0, 1), ..., (1, 1, 1, 1). In any case, as with the 4-dimensional decoder 1102, each of branch metrics E0000 to E1111 can be determined simply by adding four of error power E0 to E7.

Finally, the Viterbi decoder 1108 sequentially calculates path metrics using the 16 branch metrics E0000 to E1111 according to the Viterbi algorithm. Thus, a most likely path is selected from the possible paths, and decoding is completed.

As described above, by performing the process associated with the reproduced signal correction circuit 13 before the process associated with the multidimensional decoder 1102, it is possible to reduce the number of reference values in the learning table stored in the learning data memory 15.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures and functions.

This application claims the benefit of Japanese Application No. 2006-082975 filed Mar. 24, 2006, which is hereby incorporated by reference herein in its entirety.

What is claimed is:

1. An optical information recording/reproducing apparatus adapted to record and/or reproduce multilevel information taking three or more levels on or from an optical information recording medium adapted to record and/or reproduce information using a light spot on or from information pits formed on a track of the optical information recording medium, the information pits being formed in cells virtually formed at regular intervals on the track, the respective levels being represented by varying the length of information pits as measured in a direction along the track information pits or varying the area of the information pits such that a reproduced signal has a different amplitude level depending on the length or the area of information pits, comprising:
    a reproduced signal correction circuit adapted to correct a reproduced signal obtained by performing sampling at a center of each cell;
    an error power calculation circuit adapted to calculate error power on the basis of the difference between a corrected reproduced signal output from said reproduced signal correction circuit and an ideal value of each level of the cell; and
    a decoder adapted to perform decoding on the basis of a value obtained by said error power calculation circuit.

2. The optical information recording/reproducing apparatus according to claim 1, further comprising:
    a multilevel-data level detection circuit adapted to tentatively determine a level of a reproduced signal obtained by performing sampling at the center of each of three successive cells; and
    a learning data memory in which reference values are stored in advance, each reference value representing a reference value of a level of a central cell of three successive cells for each possible combination of levels of three successive cells, wherein
    said reproduced signal correction circuit reads, from said learning data memory, a reference value of a level of a central cell of a combination of levels of three successive cells corresponding to the levels tentatively determined by said multilevel-data level detection circuit, calculates the difference between the read reference value and the reproduced signal obtained by performing sampling at the center of the central cell, and corrects the reproduced signal based on a calculation result.

3. The optical information recording/reproducing apparatus according to claim 1, wherein the decoder is a 4-dimensional decoder adapted to determine a branch metric from metrics of four cells.

4. A method of recording/reproducing optical information in the form of multilevel information taking three or more levels on or from an optical information recording medium adapted to record and/or reproduce information using a light spot from information pits formed on a track of the optical information recording medium, the information pits being formed in cells virtually formed at regular intervals on the track, the respective levels being represented by varying the length of information pits as measured in a direction along the track information pits or varying the area of the information pits such that a reproduced signal has a different amplitude level depending on the length or the area of information pits, comprising the steps of:
    correcting a reproduced signal obtained by performing sampling at a center of each cell;
    calculating error power on the basis of the difference between a corrected reproduced signal obtained in said correcting step and an ideal value of each level of the cell; and
    performing decoding on the basis of a value obtained in said calculating step.

5. The optical information recording/reproducing method according to claim 4, wherein the said correcting step further includes the steps of:
    tentatively determining a level of a reproduced signal obtained by performing sampling at the center of each of three successive cells; and
    reading, from a learning data memory, a reference value of a level of a central cell of a combination of levels of three successive cells corresponding to the levels tentatively determined in said tentatively determining step;
    calculating the difference between the reference value and the reproduced signal obtained by performing sampling at the center of the central cell; and
    correcting the reproduced signal based on a calculation result obtained in said calculating step.

* * * * *